United States Patent
Kyoh et al.

(10) Patent No.: US 6,542,237 B1
(45) Date of Patent: Apr. 1, 2003

(54) EXPOSURE METHOD FOR MAKING PRECISION PATTERNS ON A SUBSTRATE

(75) Inventors: Suigen Kyoh, Kanagawa-ken (JP); Iwao Higashikawa, Tokyo (JP); Soichi Inoue, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/520,630

(22) Filed: Mar. 7, 2000

(30) Foreign Application Priority Data

Mar. 8, 1999 (JP) .............................. 11-060708

(51) Int. Cl.[7] .............................. G01B 11/00; G03F 9/00
(52) U.S. Cl. .............................. 356/401; 430/5; 430/22
(58) Field of Search .............................. 356/399, 400, 356/401; 355/52, 53; 430/5, 22, 30

(56) References Cited

U.S. PATENT DOCUMENTS

| | | | |
|---|---|---|---|
| 4,918,320 A | | 4/1990 | Hamasaki et al. |
| 5,243,195 A | * | 9/1993 | Nishi .......................... 250/548 |
| 5,532,822 A | * | 7/1996 | Shinozaki et al. .......... 356/363 |
| 5,798,195 A | * | 8/1998 | Nishi .......................... 430/22 |
| 5,800,949 A | * | 9/1998 | Edo et al. ....................... 430/5 |
| 5,805,866 A | * | 9/1998 | Magome et al. ............ 395/500 |
| 5,973,766 A | * | 10/1999 | Matsuura ...................... 355/52 |
| 6,097,473 A | * | 9/2000 | Ota et al. ...................... 355/53 |
| 6,340,542 B1 | * | 1/2002 | Inoue et al. ................... 430/5 |
| 6,319,637 B1 | * | 11/2002 | Higashikawa et al. ........ 430/5 |
| 6,481,003 B1 | * | 11/2002 | Maeda ......................... 716/21 |

* cited by examiner

Primary Examiner—Frank G. Font
Assistant Examiner—Layla Lauchman
(74) Attorney, Agent, or Firm—Finnegan, Henderson, Farabow, Garrett & Dunner, L.L.P.

(57) ABSTRACT

An exposure method forms a plurality of patterns on a substrate, which is set on a stage of an exposure apparatus, through at least one mask. The method equalizes first positional linear error components of a pattern to be formed by the mask on a first coordinate system defined on the substrate to second positional linear error components of the pattern on a second coordinate system on which the stage is moved, by correcting coordinates for moving the stage on the second coordinate system. The method is capable of aligning the boundaries of patterns with each other on the substrate, to leave only positional linear error components on the patterns. These positional linear error components are removable to leave minimum random residual errors on the patterns, and therefore, the patterns on the substrate are precisely at specified positions.

10 Claims, 10 Drawing Sheets

FIG. 3

| ERROR FACTOR\LINEAR ERROR | SCALE X [ppm] | SCALE Y [ppm] | ORTHOGONALITY [μrad] |
|---|---|---|---|
| MASK | -1.2 | -0.9 | -0.3 |
| PATTERN | -0.7 | -0.6 | -0.8 |
| EXPOSURE APPARATUS | -0.5 | -0.3 | -1.1 |

FIG. 4

| ERROR FACTOR\LINEAR ERROR | SCALE X [ppm] | SCALE Y [ppm] | ORTHOGONALITY [μrad] |
|---|---|---|---|
| MASK : M | -1.2 | -0.9 | 0.3 |
| EXPOSURE APPARATUS : E | 0.5 | 0.3 | -1.1 |
| PATTERN : P | -0.7 | -0.6 | -0.8 |
| STAGE : S | 0.5 | 0.2 | 0.3 |
| STAGE CORRECTION : Sa | -1.2 | -0.8 | -1.1 |

FIG. 5

| ERROR FACTOR\LINEAR ERROR | SCALE X [ppm] | SCALE Y [ppm] | ORTHOGONALITY [μrad] | (X+Y)/2 [ppm] |
|---|---|---|---|---|
| MASK A : Ma | -1.2 | -0.9 | 0.3 | -1.05 |
| MASK B : Mb | 0.3 | 0.9 | -0.5 | 0.6 |
| MASK B (ADJUSTED) : Mb2 | -1.35 | -0.75 | -0.5 | -1.05 |
| MASK av : Mav | -1.3 | -0.8 | -0.1 | -1.05 |
| EXPOSURE APPARATUS : E2 | 0.5 | 0.3 | -1.1 | — |
| PATTERN : P2 | -0.8 | -0.5 | -1.2 | — |
| STAGE :S2 | 0.5 | 0.2 | 0.3 | — |
| STAGE CORRECTION : Sa2 | -1.3 | -0.7 | -1.5 | — |

FIG. 7

| ERROR FACTOR \ LINEAR ERROR | SCALE X [ppm] | SCALE Y [ppm] | ORTHOGONALITY [μ rad] |
|---|---|---|---|
| MASK C : Mc | -0.8 | -0.3 | 0.6 |
| MASK D : Md | 0.1 | 0.5 | -0.4 |
| MASK C (ADJUSTED) : Mc2 | 0.2 | -0.3 | -0.5 |
| MASK D (ADJUSTED) : Md2 | 0.2 | -0.3 | -0.5 |
| EXPOSURE APPARATUS : E3 | 0.2 | 0.5 | 0.1 |
| PATTERN : P3 | 0.4 | 0.2 | -0.4 |
| STAGE : S3 | 0.4 | 0.2 | -0.4 |

FIG. 9

| ERROR FACTOR\LINEAR ERROR | SCALE X [ppm] | SCALE Y [ppm] | ORTHOGONALITY [μ rad] |
|---|---|---|---|
| MASK C | -0.8 | -0.3 | 0.6 |
| MASK D | 0.1 | 0.5 | -0.4 |
| MASK C (ADJUSTED) | -0.2 | -0.5 | -0.1 |
| MASK D (ADJUSTED) | -0.2 | -0.5 | -0.1 |
| EXPOSURE APPARATUS PATTERN | 0.2 | 0.5 | 0.1 |
| PATTERN | 0.0 | 0.0 | 0.0 |
| STAGE | 0.0 | 0.0 | 0.0 |

MASTER MASK

DAUGHTER MASK

EXPOSURE SHOT AREA

EXPOSURE METHOD FOR MAKING PRECISION PATTERNS ON A SUBSTRATE

BACKGROUND OF THE INVENTION

1. Field of the Invention

The present invention relates to an exposure method, and particularly, to an exposure method used to form a daughter mask from a master mask or to form a semiconductor device having precision patterns.

2. Description of the Related Art

A step-and-repeat exposure method moves a stage of an exposure apparatus on which a substrate is set by a predetermined distance whenever makes a shot of exposure on the substrate through a mask. By repeating the stage-moving and exposing processes, the method forms patterns on the substrate from the mask.

This method never considers positional linear errors including scaling and orthogonality errors related to the mask, an optical system of the exposure apparatus, and the stage of the exposure apparatus. There is, indeed, no need of considering such linear errors when forming a pattern on a new substrate by exposure, or it is only required to control overlapping correctness when forming a pattern on another pattern on a substrate. Namely, the prior art controls positional errors of a pattern only on a coordinate system defined on the substrate. To correctly form patterns on a substrate, it is necessary to control positional errors of the patterns not only on the coordinate system defined on the substrate but also on a coordinate system on which the stage is moved.

Recent technology uses master masks having different patterns to form an integrated pattern on a substrate by successively exposing the substrate through the master masks, so that the exposed substrate may be used as a daughter mask.

FIG. 10 shows examples of such master and daughter masks. Master masks I to VI have different patterns and are used one after another to expose a substrate by an exposure apparatus and form an integrated pattern on the substrate serving as the daughter mask. At this time, boundaries of the six exposure shot areas on the substrate must align with one another. To achieve this, it is necessary to precisely control not only positional errors of the shot areas on a coordinate system defined on a stage of the exposure apparatus but also positional errors thereof on a coordinate system on which the stage is moved.

Under ideal exposure conditions involving no linear errors, the boundaries of exposure shot areas on a substrate align with one another and cross patterns in the exposure shot areas are on rectangular coordinates, as shown in FIG. 11.

In practice, the boundaries of shot areas on a substrate separate from one another as shown in FIG. 12. This is because a coordinate system defined on a stage of an exposure apparatus on which the substrate is set is misaligned with a coordinate system on which the stage is moved. In this case, cross patterns in the exposure shot areas deviate from rectangular coordinates.

Positional errors of patterns on a substrate are frequently very large and nonlinear because they are an accumulation of mask and apparatus errors.

The conventional exposure method is unable to solve these errors, and therefore, is incapable of forming precision patterns on a substrate.

SUMMARY OF THE INVENTION

An object of the present invention is to provide an exposure method capable of precisely adjusting the positions of patterns on a substrate.

In order to accomplish the object, the present invention provides a method of repeatedly exposing a substrate, which is set on a stage of an exposure apparatus, through at least one mask to form patterns on the substrate. The method includes the steps of finding first positional linear errors of a pattern to be formed by the mask on a first coordinate system defined on the substrate and second positional linear errors of the pattern on a second coordinate system on which the stage is moved, and correcting a scaling factor of the exposure apparatus, or coordinates for moving the stage on the second coordinate system, or both, to equalize the first and second linear errors to each other.

The first aspect eliminates the difference between the first and second positional linear errors. As a result, a complex of the first and second positional linear errors is also linear and is removable to leave only random residual errors. Consequently, the first aspect is capable of precisely forming patterns on a substrate by exposure through masks.

A second aspect of the present invention provides a method of repeatedly exposing a substrate, which is set on a stage of an exposure apparatus whose optical scaling factor is adjustable, through a mask to form patterns on the substrate. The method includes the steps of finding, according to positional linear error components specific to the mask and positional linear error components specific to the exposure apparatus, first linear errors of a pattern to be formed by the mask on a first coordinate system defined on the substrate, finding second linear errors as differences between the first linear errors and linear errors specific to the stage, and correcting, according to the second linear errors, coordinates for moving the stage on a second coordinate system.

The second aspect eliminates the difference between the first and second coordinate systems. As a result, only linear errors that are removable remain. The second aspect grasps linear errors specific to the exposure apparatus and corrects coordinates for moving the stage on the second coordinate system without actually forming a sample pattern on a substrate and measuring the same whenever a mask is replaced.

A third aspect of the present invention provides a method of repeatedly exposing a substrate, which is set on a stage of an exposure apparatus, through a plurality of masks to form patterns on the substrate. The method includes the steps of calculating, for each mask, the average of X- and Y-scale errors specific to the mask, adjusting a scaling factor of the exposure apparatus to equalize the X-Y-scale-error averages of the masks to one another, calculating linear-error averages of the masks after the scaling factor correction, using the linear-error averages as representative positional linear errors of each mask, calculating linear errors of a pattern to be formed by a given mask on a first coordinate system defined on the substrate according to the representative positional linear errors and positional linear errors specific to the exposure apparatus.

The third aspect considerably reduces the difference between the positional linear errors of a pattern to be formed by the mask on the first coordinate system defined on the substrate and the positional linear errors of the pattern on the second coordinate system.

A fourth aspect of the present invention provides a method of repeatedly exposing a substrate, which is set on a stage of an exposure apparatus whose linear errors are separately adjustable, through a plurality of masks to form patterns on the substrate. The method includes the step of equalizing, for each mask, first linear error components of a pattern to be formed by the masks on a first coordinate system defined on the substrate to second linear error components on a second coordinate system on which the stage is moved.

The fourth aspect eliminates the difference between the positional linear errors on the first coordinate system defined on the substrate and the positional linear errors on the second coordinate system.

BRIEF DESCRIPTION OF THE DRAWINGS

FIGS. 3 and 4 are tables showing positional linear error components related to a second embodiment of the present invention;

FIG. 5 is a table showing positional linear error components related to a third embodiment of the present invention;

FIG. 7 is a table showing positional linear error components related to a fifth embodiment of the present invention;

FIG. 9 is a table showing linear error components related to the fifth embodiment;

DESCRIPTION OF THE PREFERRED EMBODIMENTS

Various embodiments of the present invention will be described with reference to the accompanying drawings.

The embodiments use a stepper-type exposure apparatus or a scanner-type exposure apparatus. The stepper-type exposure apparatus is capable of correcting only an optical scaling factor for a pattern to be formed on a substrate. Namely, the stepper-type exposure apparatus corrects linear errors by adjusting an optical scaling factor, and therefore, is unable to separately correct X- and Y-scale errors and involves a constant X/Y ratio. The scanner-type exposure apparatus is capable of separately correcting linear errors when projecting a pattern onto a substrate. The stepper-type exposure apparatus used by the embodiments is NSR-2005111D produced by Nikon Co., and the scanner-type exposure apparatus used by the embodiments is NSR-S201A produced by Nikon Co.

Among positional errors of a pattern formed on a substrate by exposure, the embodiments consider linear errors related to 1) a mask, 2) an exposure apparatus, and 3) a stage of the exposure apparatus. The linear errors related to a mask involve X- and Y-scale errors and rotational error. The linear errors related to an exposure apparatus are specific to the exposure apparatus and affect a mask set on the exposure apparatus. The linear errors related to the stage of an exposure apparatus are specific to the stage on which substrate is set.

First Embodiment

An exposure method according to the first embodiment of the present invention will be explained.

This method uses a standard stepper-type exposure apparatus that is capable of correcting only an optical scaling factor and forms patterns on a substrate through exposure shots based on step-and-repeat processes with the use of a single mask having a pattern. Exposure shots are made such that the boundaries of shot areas on a substrate align with one another.

Patterns formed on a substrate may have allowable positional linear errors if the substrate is used as a daughter mask because the positional linear errors on the daughter mask are correctable by scanner-type exposure apparatus such as NSR-S201A produced by Nikon Co.

The first embodiment actually forms a pattern on an 8-inch wafer serving as a substrate through a mask. The pattern on the substrate is developed and is measured by a positional accuracy measuring device such as LMS IPRO produced by Leica Co., to find linear errors of the pattern on the substrate.

In one example that made no correction on the stage of the exposure apparatus, a pattern formed on a substrate showed an X-scale error of −1.2 ppm, a Y-scale error of −0.8 ppm, and an orthogonality error of −1.1 μrad on a pattern coordinate system defined (first coordinate system) on the stage.

Figure 12:
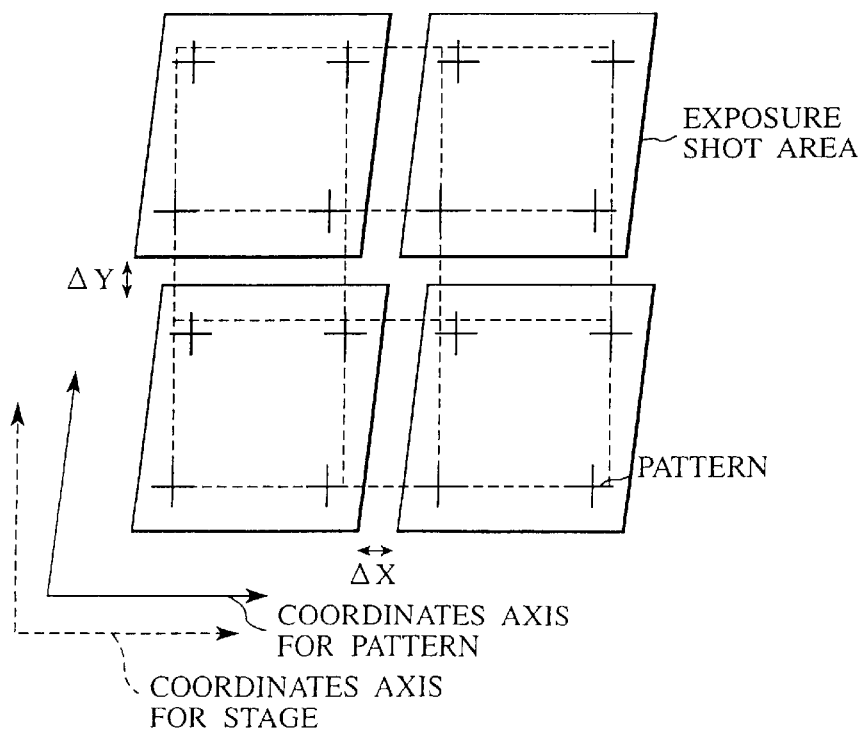
FIG. 12 shows patterns formed under conventional conditions on pattern and stage coordinate systems.

Under the same conditions, patterns were successively formed on a substrate. To remove rotational errors from the patterns, an X-axis of the pattern coordinate system was aligned with an X-axis of a stage coordinate system (second coordinate system) on which the stage was moved. After removing linear errors, each pattern showed a 3σ residual error of 64 nm in X-direction and a 3σ residual error of 52 nm in Y-direction. As a result, the boundaries of the patterns separated from one another as shown in FIG. 12. This is because a stage moving distance is larger than the size of each pattern. The size of each pattern was 20 mm by 20 mm, and a difference Δx in X-direction between adjacent patterns was 24 nm and a difference Δy in Y-direction between adjacent patterns 16 nm.

Thereafter, the first embodiment was used to form patterns on a substrate. Before forming patterns, the first embodiment adjusted stage moving distances according to the scale errors mentioned above. Namely, the first embodiment added the X-scale error of −1.2 ppm and Y-scale error of −0.8 ppm to stage moving distances in X- and Y-directions. Coordinates (X, Y) of the stage before correction and coordinates (X1, Y1) thereof after correction are expressed as follows:

$$X1 = (1 - 1.2 \times 10^{-6}) \times X \quad (1)$$

$$Y1 = (1 - 0.8 \times 10^{-6}) \times Y \quad (2)$$

Figure 1:
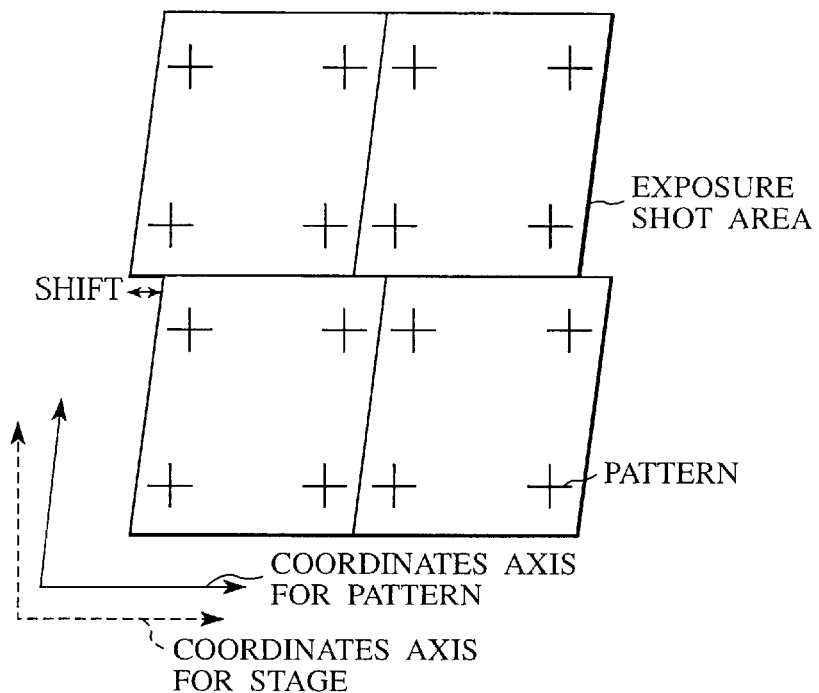
FIGS. 1 and 2 show patterns formed on a substrate by an exposure apparatus having a stage on which the substrate is set and relationships between a pattern coordinate system defined on the substrate and a stage coordinate system on which the stage is moved, according to a first embodiment of the present invention.
Figure 2:
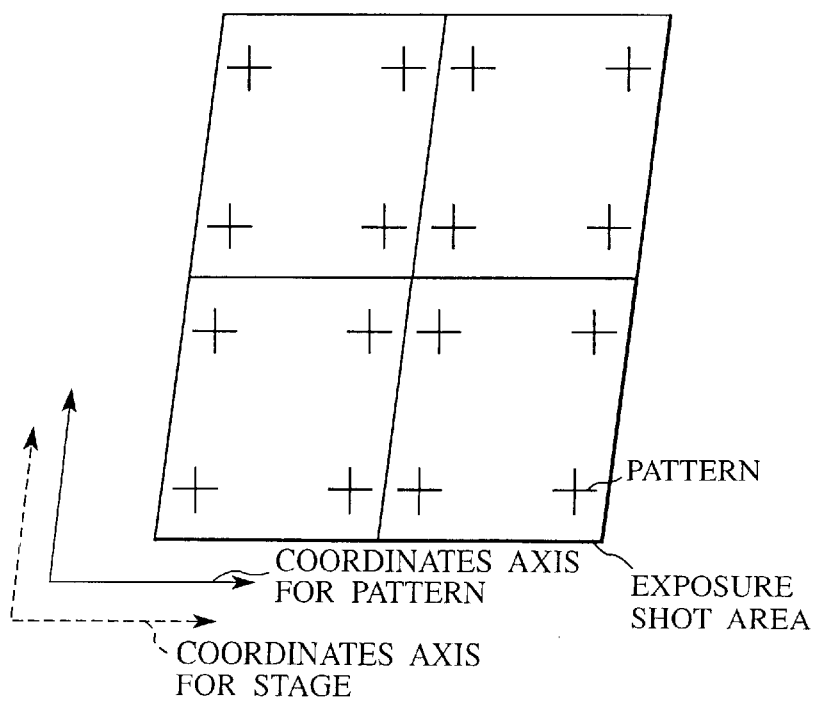

The patterns obtained by the first embodiment are shown in FIG. 1. The boundaries of four patterns are in contact with each other. After removing linear errors, each pattern showed a 3σ residual error of 43 nm in X-direction and a 3σ residual error of 32 nm in Y-direction.

There was still an orthogonality error of −1.1 μrad between the pattern coordinate system and the stage coordinate system, to cause a shift of 22 nm between the boundaries of adjacent patterns. The first embodiment corrected the orthogonality error by correcting coordinates for moving the stage on the stage coordinate system.

After the correction, the boundaries of the patterns completely aligned with each other. Namely, the pattern coordinate system completely aligned with the stage coordinate system. This means that a complex of linear errors on the pattern coordinate system and linear errors on the stage coordinate system became linear. Coordinates (X2, Y2) of the stage after the orthogonality correction are expressed as follows:

$$X2 = X1 = (1 - 1.2 \times 10^{-6}) \times X \quad (3)$$

$$Y2 = Y1 - 1.1 \times 10^{-6} \times X1 = (1 - 0.8 \times 10^{-6}) \times Y - 1.1 \times 10^{-6} \times (1 - 1.2 \times 10^{-6}) \times X \quad (4)$$

After removing the remaining linear errors, each pattern showed excellent precision, i.e., a 3σ residual error of 15 nm in X-direction and a 3σ residual error of 17 nm in Y-direction.

In this way, the first embodiment equalizes linear errors of a pattern on the pattern coordinate system to linear errors of the pattern on the stage coordinate system, thereby precisely controlling the positions of patterns on a substrate set on the stage.

Second Embodiment

An exposure method according to the second embodiment of the present invention will be explained.

Like the first embodiment, the second embodiment uses a standard stepper-type exposure apparatus that is capable of correcting only an optical scaling factor and forms patterns on a substrate through exposure shots based on the step-and-repeat technique with the use of a single mask having a pattern. Exposure shots are made such that the boundaries of shot areas align with one another.

The first embodiment mentioned above actually forms a pattern on a substrate, measures the dimensions of the pattern, and finds differences between linear errors of the pattern on a pattern coordinate system defined on a stage of the exposure apparatus on which the substrate is set and linear errors of the pattern on a stage coordinate system on which the stage is moved. The second embodiment makes correction without actually forming a pattern on a substrate.

FIG. 3 is a table showing examples of positional linear error components specific to a mask, positional linear error components specific to a pattern formed on a substrate, and linear errors specific to an exposure apparatus that forms the pattern by exposing the substrate through the mask. These linear errors are measured by LMS IPRO produced by Leica Co. Unlike the first embodiment that handles relative linear errors between a pattern coordinate system and a stage coordinate system, the second embodiment handles absolute linear errors such as those shown in FIG. 3.

In FIG. 3, the "mask errors" are positional linear errors specific to the mask, and the "pattern errors" are positional linear errors of a pattern formed on a substrate by exposing the substrate through the mask.

If the exposure apparatus itself has no linear errors, the mask errors will be equal to the pattern errors. In practice, any exposure apparatus has positional linear errors, such as "the apparatus errors" of FIG. 3, to differ the mask errors from the pattern errors.

If the mask errors and apparatus errors are known, the pattern errors are calculable without actually forming a pattern on a substrate by exposure. The pattern errors are on a pattern coordinate system defined on the substrate. The stage itself involves stage errors, which are linear errors on a stage coordinate system on which the stage is moved. The difference between the pattern errors and the stage errors is calculable and is useful to correct coordinates for moving the stage on the stage coordinate system.

FIG. 4 shows examples of linear errors and correction values for correcting coordinates for moving the stage of an exposure apparatus on a stage coordinate system. A stage coordinate correction value "Sa" is calculated from a mask error "M", an apparatus error "E", a pattern error "P", and a stage error "S" as follows:

$$P = M + E \quad (5)$$

$$Sa = P - S \quad (6)$$

where M, E, and S are independent of one another.

According to the correction value Sa, the second embodiment corrects, like the first embodiment, coordinates for moving the stage on the stage coordinate system, thereby precisely forming patterns on a substrate that is set on the stage.

Third Embodiment

An exposure method according to the third embodiment of the present invention will be explained.

Unlike the first and second embodiments that use each a single mask to expose a substrate, the third embodiment uses a plurality of masks. The masks have different patterns to form an integrated pattern on a substrate.

The third embodiment uses a standard stepper-type exposure apparatus capable of correcting only an optical scaling factor.

In the case of a single mask, linear errors of a pattern on a pattern coordinate system defined on a stage of the exposure apparatus are equalized to linear errors of the pattern on a stage coordinate system on which the stage is moved. When using a plurality of masks, it is difficult to completely remove linear errors because the masks involve different linear errors.

Accordingly, the third embodiment averages linear errors of masks to find representative linear errors and corrects stage-moving coordinates according to the representative linear errors.

FIG. 5 is a table showing examples of linear errors and stage-coordinates correction values when forming patterns on a substrate with mask A and mask B having different linear errors.

The mask A and mask B are randomly picked up and have different patterns. The mask A has an X-scale error of −1.2 ppm and a Y-scale error of −0.9 ppm, and the mask B has an X-scale error of 0.3 ppm and a Y-scale error of 0.9 ppm.

The average of the X- and Y-scale errors of the mask A is −1.05 ppm, and that of the mask B is 0.6 ppm. The difference between these average values is 1.65 ppm.

The third embodiment adjusts the error average of the mask B to that of the mask A by adjusting the optical scaling factor of the exposure apparatus on the mask B. Namely, the error difference of −1.65 ppm is added to the error average of the mask B so that the mask B may have an X-scale error of −1.35 ppm and a Y-scale error of −0.75 ppm. As a result, the X-Y-scale-error average of each of the mask A and mask B becomes −1.05 ppm.

Thereafter, the third embodiment calculates the average of the X-scale errors of the mask A and mask B and the average of the Y-scale errors of the mask A and mask B.

More precisely, the adjusted X- and Y-scale errors "Mb2x" and "Mb2y" of the mask B are calculated from the scaling errors "Max" and "May" of the mask A and the scaling errors "Mbx" and "Mby" of the mask B as follows:

$$Mb2x = Mbx + \{(Max+May)/2 - (Mbx+Mby)/2\} \quad (7)$$

$$Mb2y = Mby + \{(Max+May)/2 - (Mbx+Mby)/2\} \quad (8)$$

Each error average "Mav" of the mask A and mask B is expressed as follows:

$$Mav = (Ma + Mb2)/2 \quad (9)$$

The error averages thus calculated are used as representative linear errors of each mask to correct stage coordinates like the second embodiment.

Namely, a stage coordinate correction value "Sa2" is approximated from an apparatus error "E2", a pattern error "P2", and a stage error "S2" as follows:

$$P2 \approx Mav + E2 \quad (10)$$

$$Sa2 \approx P2 - S2 \quad (11)$$

The reason why the average of X- and Y-scale errors of each mask is calculated is because a standard stepper-type exposure apparatus such as NSR-2005111D is incapable of separately correcting X- and Y-scale errors. Although the third embodiment equalizes the error average of the mask B to that of the mask A, it is possible to adjust the error average of the mask A to that of the mask B. It is also possible to adjust the linear errors of the mask A and mask B to those of the stage.

The reason why averaging the X-scale errors of the mask A and mask B and the Y-scale errors thereof is to substantially equally correcting the linear errors of the mask A and mask B.

Error averages provided by the expression (9) are used as representative linear errors for each mask. The representative linear errors are added to apparatus errors to estimate the linear errors of a pattern to be formed on a substrate.

The estimated linear errors and the linear errors specific to the stage are used to correct coordinates for moving the stage as shown in the expression (11), thereby forming patterns on a substrate with minimum linear errors.

Although the third embodiment uses two masks, the present invention is applicable to using three or more masks.

Fourth Embodiment

An exposure method according to the fourth embodiment of the present invention will be explained.

The fourth embodiment selects masks to further improve the correctness of patterns to be formed.

As mentioned above, the third embodiment randomly selects two masks having different positional linear errors and corrects the linear errors before forming patterns on a substrate with the masks. Although the third embodiment is capable of precisely forming patterns on a substrate, it may achieve limited positional precision if the masks involve linear errors that greatly differ from each other.

When using a single mask, the mask causes no difference between actual linear errors and representative linear errors. When using a plurality of masks, they may cause difference between actual linear errors of each mask and representative linear errors. Accordingly, the third embodiment is incapable of completely removing linear errors from each mask. This results in limiting the positional precision of patterns to be formed on a substrate with the masks.

Using a single mask, therefore, always achieves higher precision than using a plurality of masks. To make a plurality of masks achieve precision equivalent to that achieved by a single mask, it is preferable that the masks have similar linear errors. In practice, however, masks have different X-scale errors, Y-scale errors, and orthogonality errors.

Figure 6:
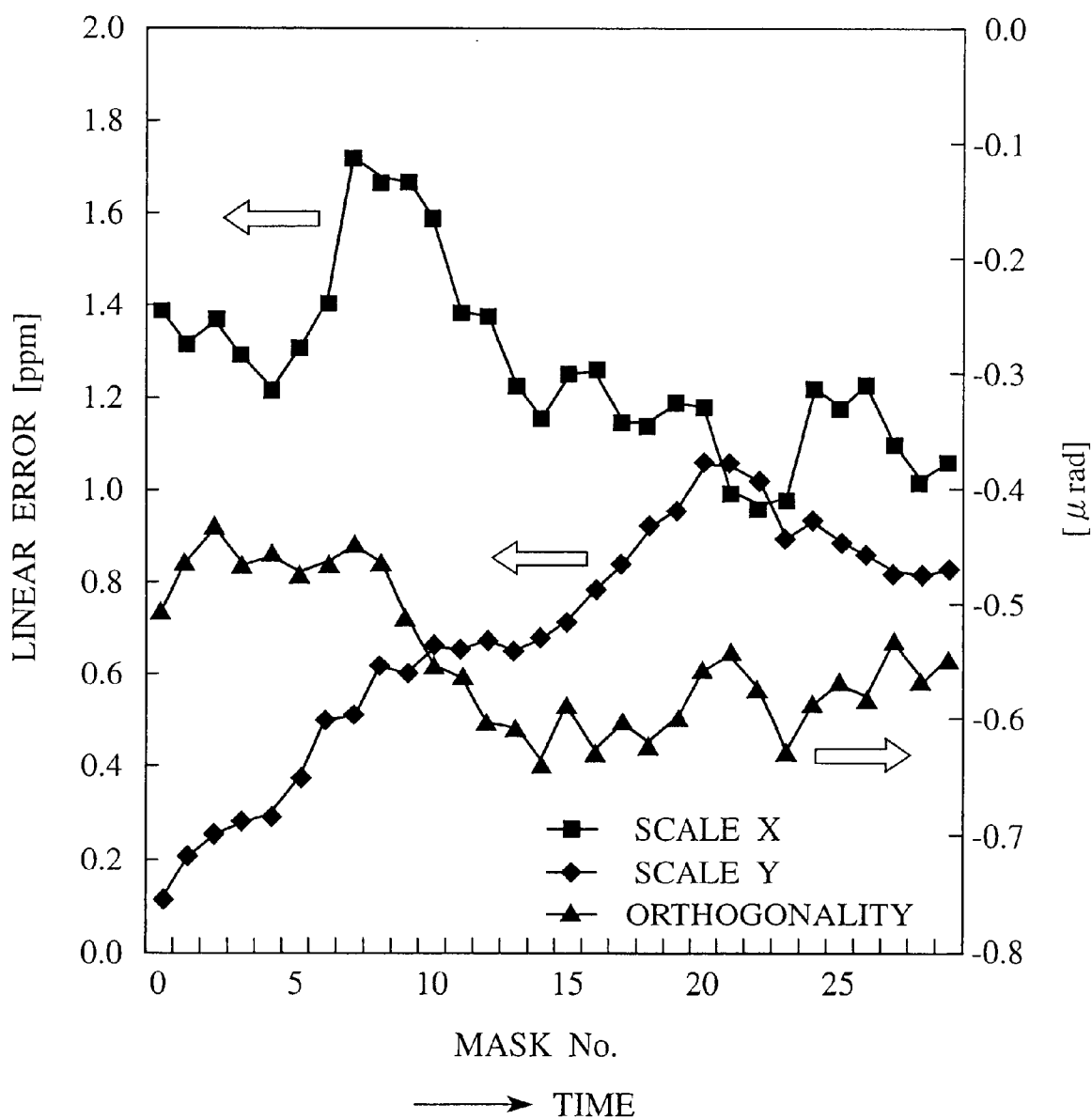
FIG. 6 is a graph showing variations of positional linear errors related to master masks prepared by a laser beam lithography apparatus, according to a fourth embodiment of the present invention.

Master masks usually produced one by one by a laser beam or electron beam writing . FIG. 6 is a graph showing variations of X-scale errors, Y-scale errors, and orthogonality errors of 30 masks that were produced by a laser lithography apparatus. An abscissa of the graph represents lot numbers of the masks and corresponds to a time axis. The laser lithography apparatus took about five days to make the 30 masks.

Variation a in normal distribution of the linear errors of the 30 masks involves 0.20 ppm in X-scale error, 0.26 ppm in Y-scale error, and 0.07 $\mu$rad in orthogonality error.

If two masks are randomly picked up from the 30 masks, a linear error difference average will be $2\sigma/\sqrt{\pi}$. In more detail, there will be an X-scale error difference of 0.23 ppm, a Y-scale error difference of 0.30 ppm, and an orthogonality error difference of 0.07 $\mu$rad.

To reduce error differences among masks, the fourth embodiment picks up masks that are consecutively formed.

The linear error differences among the masks of FIG. 6 are caused by a variety of conditions including atmospheric pressure change. The X-scale errors, Y-scale errors, and orthogonality errors of the 30 masks greatly fluctuate through the five-day lithography process. If two masks are randomly picked up from the 30 masks, the two may involve linear errors that greatly differ from each other.

To solve this problem, the fourth embodiment picks up masks that are consecutively prepared because they may involve linear errors that are similar to each other. As is apparent in FIG. 6, consecutively formed masks involve linear errors that are similar to each other.

Two consecutively formed masks picked up from the 30 masks of FIG. 6 involve an X-scale error difference of 0.09 ppm, a Y-scale error difference of 0.05 ppm, and an orthogonality error difference of 0.03 $\mu$rad that are remarkably low compared with those of randomly selected masks.

In this way, the fourth embodiment uses masks that are consecutively formed, to reduce differences between the linear errors of the masks, thereby improving the positional accuracy of patterns to be formed on a substrate with the masks.

Fifth Embodiment

An exposure method according to the fifth embodiment of the present invention will be explained.

Unlike the first to fourth embodiments, the fifth embodiment uses the scanner-type exposure apparatus capable of separately correcting linear errors.

The scanner-type exposure apparatus used by the fifth embodiment is NSR-S201A produced by Nikon Co. The scanner-type exposure apparatus has a narrower exposure area than the stepper-type exposure apparatus, however, a total exposure area is wider than the stepper-type exposure apparatus because the scanner-type exposure apparatus scans a substrate with an exposing beam. The scanner-type exposure apparatus is capable of separately correcting X- and Y-scale errors as well as an orthogonality error.

Unlike the stepper-type exposure apparatus that is capable of correcting only optical scaling factors, the scanner-type exposure apparatus is capable of separately correcting linear errors of each mask even if a plurality of masks are used to expose a substrate.

FIG. 7 is a table showing examples of positional linear error components related to mask C and mask D, the exposure apparatus, and a stage of the exposure apparatus. The mask C and mask D have different linear errors. Namely, the mask C has an X-scale error of −0.8 ppm, a Y-scale error of −0.3 ppm, and an orthogonality error of 0.6 μrad. The mask D has an X-scale error of 0.1 ppm, a Y-scale error of 0.5 ppm, and an orthogonality error of −0.4 μrad.

The fifth embodiment equalizes linear errors of the pattern provided by any one of the mask C and mask D to linear errors of the stage. Namely, the fifth embodiment corrects the exposure apparatus so that each of the mask C and mask D may have an X-scale error of 0.2 ppm, a Y-scale error of −0.3 ppm, and an orthogonality error of −0.5 μrad.

The exposure apparatus itself has an X-scale error of 0.2 ppm, a Y-scale error of 0.5 ppm, and an orthogonality error of 0.1 μrad. This means that a pattern formed on a substrate by any one of the mask C and mask D involves the sum of the linear errors caused by the mask (adjusted) and exposure apparatus. Namely, each pattern has an X-scale error of 0.4 ppm, a Y-scale error of 0.2 ppm, and an orthogonality error of −0.4 μrad on a pattern coordinate system defined on the substrate. These linear errors are equal to the linear errors of the stage appearing on a stage coordinate system on which the stage is moved, and therefore, there is no need of correcting coordinates for moving the stage on the stage coordinate system.

A pattern linear error "P3" and a stage linear error "S3" are expressed based on an adjusted linear error "Mc2" of the mask C, an adjusted linear error "Md2" of the mask D, and an exposure apparatus linear error "E3" as follows:

$$P3=S3 \quad (12)$$

$$P3=Mc2+E3, \text{ or } P3=Md2+E3 \quad (13)$$

To satisfy the equations (12) and (13), the fifth embodiment adjusts the exposure apparatus when forming patterns on a substrate through the mask C and mask D. The adjustment is made to equalize the pattern linear errors to the stage linear errors, to avoid nonlinear errors to be created. More precisely, the linear errors of each mask are equalized to the difference between the stage linear errors and the exposure apparatus linear errors.

In this way, the fifth embodiment equalizes pattern linear errors to stage linear errors, so that errors remaining on patterns formed on a substrate may also be linear.

Figure 8:
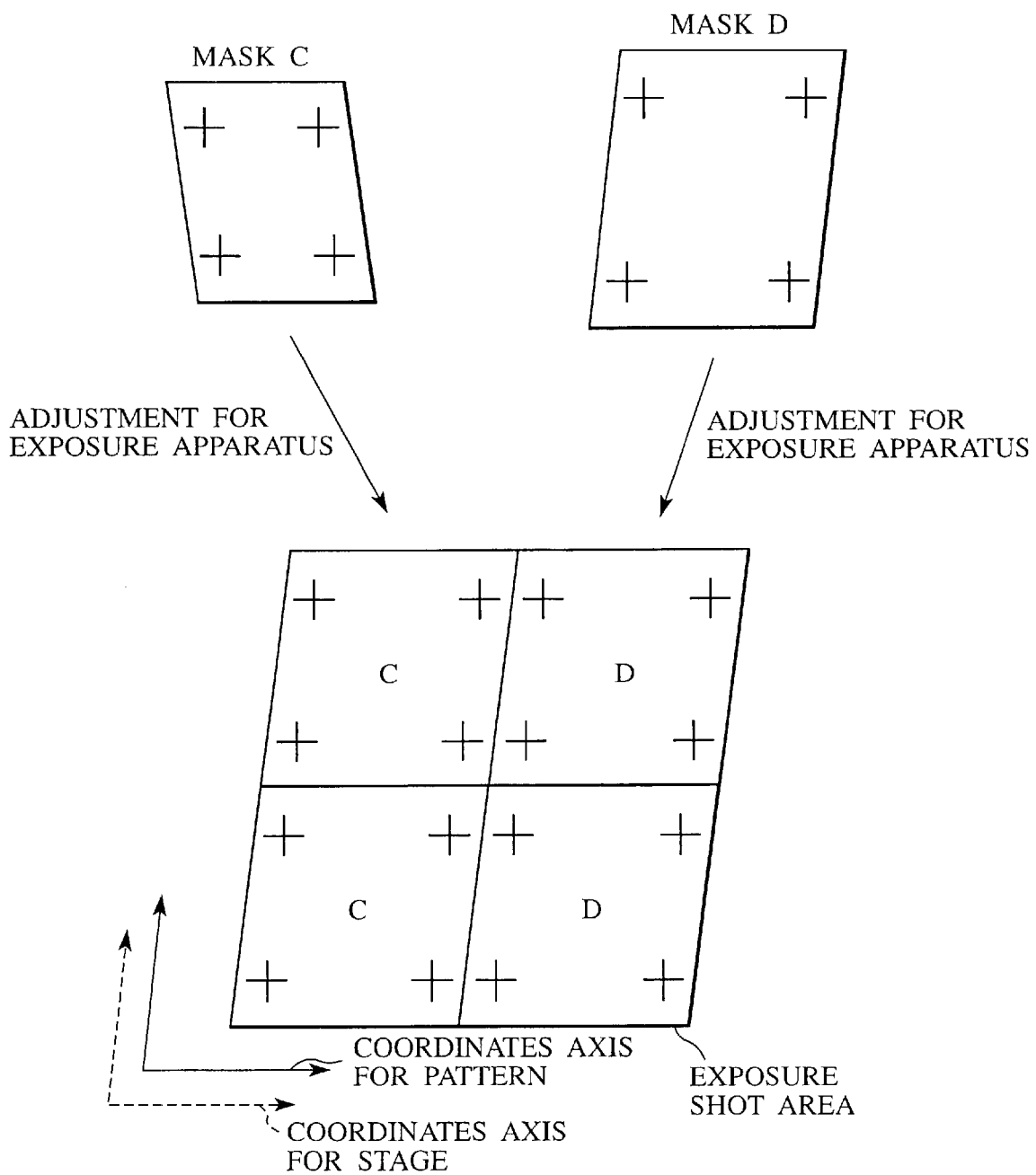
FIG. 8 shows an exposure method according to the fifth embodiment.
Figure 10:
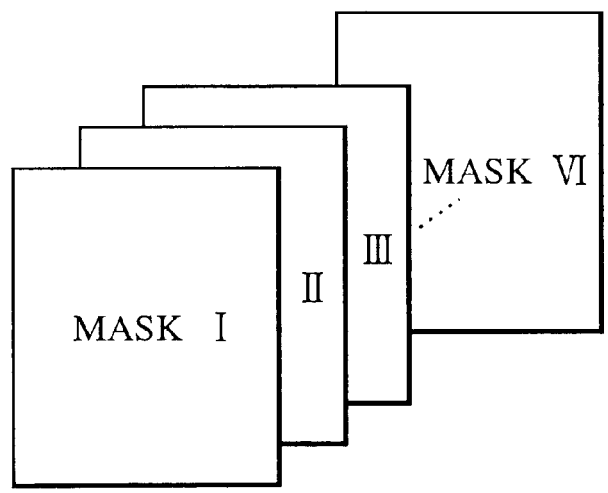
FIG. 10 shows a method of forming an integrated pattern through exposure shots with the use of master masks.
Figure 10:
Figure 10:
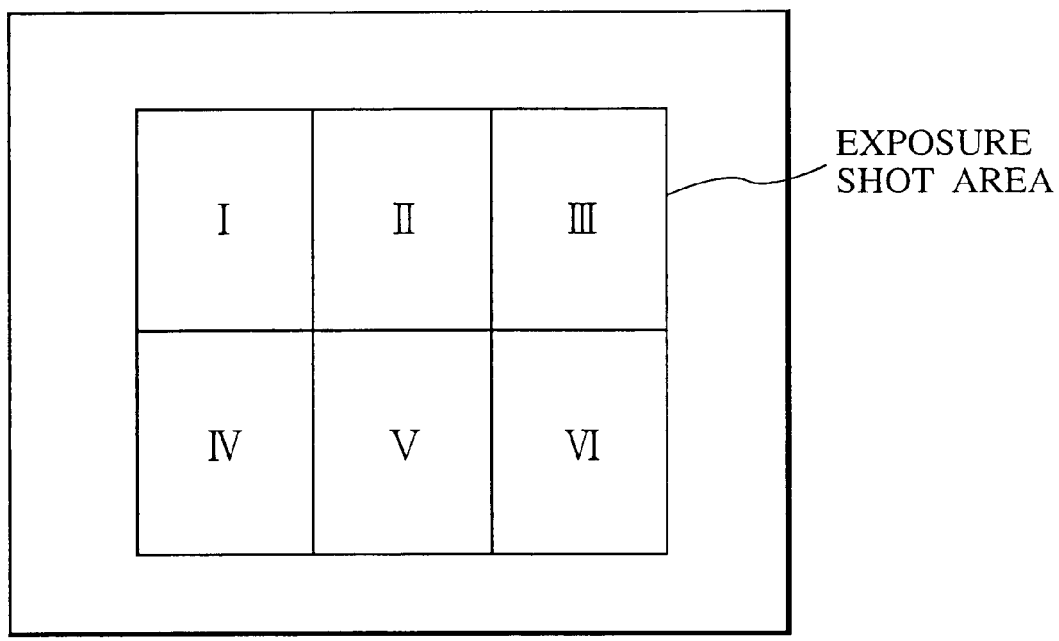
Figure 11:
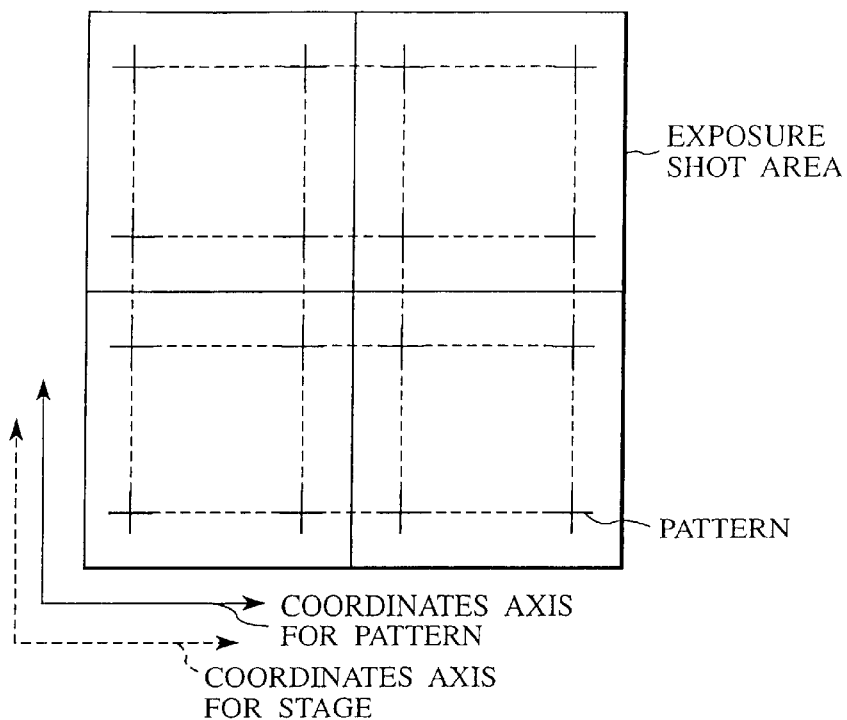
FIG. 11 shows patterns formed under ideal conditions on a pattern coordinate system and a stage coordinate system.

FIG. 8 shows the steps of correcting the mask C and mask D according to the fifth embodiment. Two exposure shots are made on each of the mask C and mask D, to form an integration of patterns shown in a lower part of FIG. 8. The shots are made so that the boundaries of the shots are aligned with each other. As shown in an upper part of FIG. 8, the mask C and mask D have different linear error components, and therefore, they form patterns involving large positional errors if no correction is made on the exposure apparatus.

The fifth embodiments makes the above-mentioned correction on the exposure apparatus, to provide the integrated pattern shown in the lower part of FIG. 8 with the boundaries of the patterns being aligned with each other. After removing the remaining linear errors, the integrated pattern involves a residual error of 18 nm in X direction and a residual error of 20 nm in Y direction.

The example shown in FIG. 8 exposes a substrate through the mask C and mask D with the stage having positional linear errors. Accordingly, the integrated pattern formed on the substrate involves the stage positional linear errors. The linear errors remaining on the substrate may cause no problem in some case. It is preferable, however, to remove the stage linear errors to minimize linear errors on the integrated pattern.

FIG. 9 is a table showing the mask C and mask D with the exposure apparatus being adjusted to cancel the linear errors specific to the exposure apparatus, thereby removing positional linear errors of patterns on the pattern coordinate system defined on the substrate. At the same time, the positional linear errors specific to the stage are removed to remove positional linear errors of the patterns on the stage coordinate system on which the stage is moved.

The above steps correcting 2 masks of mask C and mask D may apply for correcting 3 or more masks.

The fifth embodiment removes linear errors of patterns on the pattern coordinate system as well as those on the stage coordinate system, so that the patterns may be ideal without positional linear errors.

Various modifications will become possible for those skilled in the art after receiving the teachings of the present disclosure without departing from the scope thereof.

What is claimed is:

1. A method of repeatedly exposing a substrate, which is set on a stage of an exposure apparatus, through at least one mask to form patterns on the substrate, comprising the steps of:

finding first positional linear error components of a pattern to be formed by the mask on a first coordinate system defined on the substrate and second positional linear error components of the pattern on a second coordinate system on which the stage is moved; and adjusting a scaling factor of the exposure apparatus, or coordinates for moving the stage on the second coordinate system, or both, to equalize the first and second positional linear error components to each other.

2. The method of claim 1, wherein the positional linear error components include at least an X-scale error, a Y-scale error, and an orthogonality error.

3. The method of claim 1, wherein the first positional linear error components are found based on positional linear error components specific to the mask and positional linear error components specific to the exposure apparatus.

4. A method of repeatedly exposing a substrate, which is set on a stage of an exposure apparatus whose optical scaling factor is adjustable, through a mask to form patterns on the substrate, comprising the steps of:

finding first positional linear error components of a pattern to be formed by the mask on a first coordinate system defined on the substrate according to positional linear error components specific to the mask and positional linear error components specific to the exposure apparatus;

finding differences between the first positional linear error components and positional linear error components specific to the stage; and correcting coordinates for moving the stage on a second coordinate system according to the differences.

5. The method of claim 4, wherein the positional linear error components involve at least an X-scale error, a Y-scale error, and an orthogonality error.

6. A method of repeatedly exposing a substrate, which is set on a stage of an exposure apparatus, through a plurality of masks to form patterns on the substrate, comprising the steps of:

calculating the average of X- and Y-scale errors specific to the mask for each mask;

adjusting a scaling factor of the exposure apparatus to equalize the X-Y-scale-error averages of the masks to one another for each mask;

calculating linear-error averages of the masks after the scaling factor correction;

using the linear-error averages as representative positional linear error components of each mask;

calculating positional linear error components of a pattern to be formed by the masks on a first coordinate system defined on the substrate according to the representative positional linear error components and positional linear error components specific to the exposure apparatus;

calculating differences between the positional linear error components of the pattern and positional linear error components specific to the stage; and correcting, according to the differences, coordinates for moving the stage on a second coordinate system.

7. The method of claim 6, wherein the masks are those consecutively produced by a beam lithography apparatus.

8. A method of repeatedly exposing a substrate, which is set on a stage of an exposure apparatus whose positional linear error components are separately adjustable, through a plurality of masks to form patterns on the substrate, comprising the step of:

adjusting the exposure apparatus to equalize, for each mask, first positional linear error components of a pattern to be formed by the mask on a first coordinate system defined on the substrate to second positional linear error components of the pattern on a second coordinate system on which the stage is moved.

9. The method of claim 8, wherein the positional linear error components include at least an X-scale error, a Y-scale error, and an orthogonality error.

10. A method of repeatedly exposing a substrate, which is set on a stage of an exposure apparatus whose positional linear error components are separately adjustable, through a plurality of masks to form patterns on the substrate, comprising the steps of:

finding positional linear error components specific to the mask for each mask;

finding positional linear error components specific to the exposure apparatus;

finding positional linear error components specific to the stage; and adjusting the exposure apparatus to equalize, for each mask, first positional linear error components of a pattern to be formed by the mask on a first coordinate system defined on the substrate to second positional linear error components of the pattern on a second coordinate system on which the stage is moved.

* * * * *